(12) United States Patent
Qiu

(10) Patent No.: US 11,808,444 B2
(45) Date of Patent: *Nov. 7, 2023

(54) WIDE BEAM ANGLE LED ASSEMBLY

(71) Applicant: Lumileds LLC, San Jose, CA (US)

(72) Inventor: Yifeng Qiu, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/742,119

(22) Filed: May 11, 2022

(65) Prior Publication Data
US 2022/0268432 A1 Aug. 25, 2022

Related U.S. Application Data

(63) Continuation of application No. 16/996,300, filed on Aug. 18, 2020, now Pat. No. 11,371,687.

(60) Provisional application No. 62/952,932, filed on Dec. 23, 2019, provisional application No. 62/890,850, filed on Aug. 23, 2019.

(51) Int. Cl.
F21V 23/06 (2006.01)
H05K 1/18 (2006.01)
F21S 4/24 (2016.01)
F21Y 115/10 (2016.01)

(52) U.S. Cl.
CPC ............... *F21V 23/06* (2013.01); *F21S 4/24* (2016.01); *H05K 1/189* (2013.01); *F21Y 2115/10* (2016.08); *H05K 2201/10106* (2013.01)

(58) Field of Classification Search
CPC .... F21V 23/06; F21S 4/24; F21S 8/04; H05K 1/189; H05K 2201/10106; F21Y 2115/10; F21Y 2105/12; F21Y 2107/30; F21Y 2107/70
See application file for complete search history.

(56) References Cited

U.S. PATENT DOCUMENTS

| 8,421,329 | B2* | 4/2013 | Liang ................... F21V 29/773 313/317 |
| 8,698,290 | B2* | 4/2014 | Masumoto .............. F21K 9/232 257/784 |
| 8,888,330 | B2 | 11/2014 | Kang et al. |
| 8,985,794 | B1 | 3/2015 | Katona et al. |
| 9,194,556 | B1 | 11/2015 | Nelson et al. |
| 9,328,873 | B2 | 5/2016 | Huang et al. |
| 9,435,491 | B2 | 9/2016 | Chang et al. |
| 9,482,416 | B2 | 11/2016 | Narag et al. |

(Continued)

OTHER PUBLICATIONS

U.S. Appl. No. 16/996,300, filed Aug. 18, 2020, Wide Beam Angle LED Assembly.

(Continued)

*Primary Examiner* — Tsion Tumebo
(74) *Attorney, Agent, or Firm* — Schwegman, Lundberg & Woessner, P.A.

(57) ABSTRACT

A LED assembly includes a baseplate and a diffuser. A circuit board connected to the baseplate has a first set of LEDs directed to emit light toward the diffuser. Additionally, a frame is attached to the baseplate and positioned to surround the circuit board. A flexible circuit with a second set of LEDs is attached to the frame, with the LEDs positioned to emit light predominantly perpendicular with respect to the first set of LEDs.

20 Claims, 4 Drawing Sheets

(56) References Cited

U.S. PATENT DOCUMENTS

| | | | |
|---|---|---|---|
| 2011/0199753 A1* | 8/2011 | Ramer | F21K 9/62 |
| | | | 313/503 |
| 2011/0215696 A1 | 9/2011 | Tong et al. | |
| 2012/0043878 A1 | 2/2012 | Liang et al. | |
| 2012/0049732 A1 | 3/2012 | Chuang | |
| 2012/0268936 A1 | 10/2012 | Pickard et al. | |
| 2013/0027928 A1* | 1/2013 | Kang | F21K 9/60 |
| | | | 362/249.02 |
| 2014/0036497 A1 | 2/2014 | Hussell, et al. | |
| 2014/0146536 A1 | 5/2014 | Li | |
| 2014/0240990 A1 | 8/2014 | Bae | |
| 2015/0117007 A1 | 4/2015 | Chang et al. | |
| 2015/0377421 A1 | 12/2015 | Chen | |
| 2017/0208693 A1* | 7/2017 | Van Bommel | H05K 1/189 |
| 2017/0227177 A1 | 8/2017 | Power et al. | |
| 2018/0372276 A1 | 12/2018 | Su et al. | |
| 2021/0054994 A1 | 2/2021 | Qui | |

OTHER PUBLICATIONS

"U.S. Appl. No. 16/996,300, Examiner Interview Summary dated Dec. 2, 2021", 2 pgs.

"U.S. Appl. No. 16/996,300, Non Final Office Action dated Sep. 2, 2021", 16 pgs.

"U.S. Appl. No. 16/996,300, Notice of Allowance dated Feb. 15, 2022", 8 pgs.

"U.S. Appl. No. 16/996,300, Response filed Dec. 2, 2021 to Non Final Office Action (dated Sep. 2, 2021", 8 pgs.

\* cited by examiner

WIDE BEAM ANGLE LED ASSEMBLY

CLAIM OF PRIORITY

This application is a continuation of U.S. patent application Ser. No. 16/996,300, filed Aug. 18, 2020, which claims the benefit of priority to U.S. Provisional Application Ser. No. 62/890,850, filed Aug. 23, 2019, and claims the benefit of priority to U.S. Provisional Application Ser. No. 62/952,932, filed Dec. 23, 2019, each of which is incorporated herein in its entirety by reference.

TECHNICAL FIELD

The present disclosure relates generally to a ceiling or general illumination light emitting diode (LED) light assembly with a wide beam radiation pattern.

BACKGROUND

Ceiling mounted incandescent bulb illumination systems traditionally had several advantages. Incandescent bulbs were inexpensive to control and mount and can easily provide a wide radiation pattern. Additionally, produced light can have a desired color, assuming proper selection of bulbs having a desired color temperature.

General illumination LED lighting systems can also be mounted on ceilings or walls of buildings and are widely used in locations formerly supporting incandescent bulbs. Unfortunately, without expensive integrated optics, such lighting systems typically present a Lambertian radiation pattern, with most light captured within 160° angle. Unfortunately, this eliminates almost all light when viewed from the side. In the ceiling light application, it is a desirable to have as wide a radiation pattern as possible, sufficient to mimic that of an incandescent bulb.

In addition to problems associated with providing wide beam angles, being able to uniformly provide light of one or more colors can be difficult. LED systems typically support multiple LEDs of differing colors that require careful positioning to ensure far field color mixing. Since LEDs of various color can be distributed over a large area, effective far field color mixing can be difficult.

SUMMARY

In one embodiment, an LED assembly includes a baseplate and a diffuser. A circuit board connected to the baseplate has a first set of LEDs directed to emit light toward the diffuser. Additionally, a frame is attached to the baseplate and positioned to surround the circuit board. A flexible circuit with a second set of LEDs is attached to the frame, with the LEDs positioned to emit light predominantly perpendicular with respect to the first set of LEDs.

In one embodiment, the circuit board is positioned in a center of the baseplate.

In one embodiment, the diffuser, circuit board, and baseplate are circular.

In one embodiment, the first and second set of LEDs are connected to each other in parallel.

In one embodiment, the first and second set of LEDs have the same number of LEDs.

In one embodiment, color of the first and second set of LEDs is adjustable.

In one embodiment, ends of the flexible circuit are attached to each other.

In one embodiment, ends of the flexible circuit further comprise solder pads.

In one embodiment, ends of the flexible circuit further comprise tabs extending from the flexible circuit and including solder pads.

In one embodiment, the first and second set of LEDs are connected to a power and control module.

In another embodiment, a lighting system includes a power and control module and a circuit board with a first set of LEDs directed to emit light in a first direction. A frame is positioned to surround the circuit board and a flexible circuit with a second set of LEDs is positioned to emit light at a second direction distinct with respect to the first set of LEDs.

DETAILED DESCRIPTION

Figure 1A:
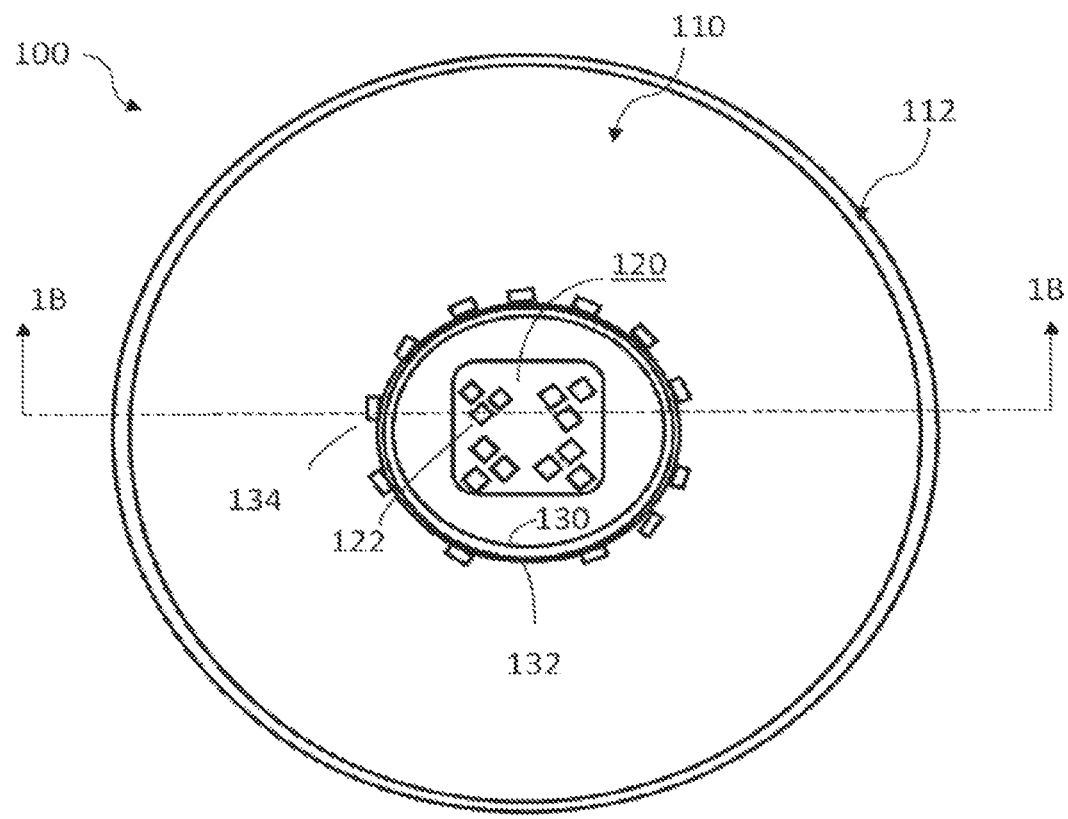
FIGS. 1A and 1B respectively illustrate in top and cross sectional view an example of a light suitable for ceiling attachment and having improved light uniformity.
Figure 1B:
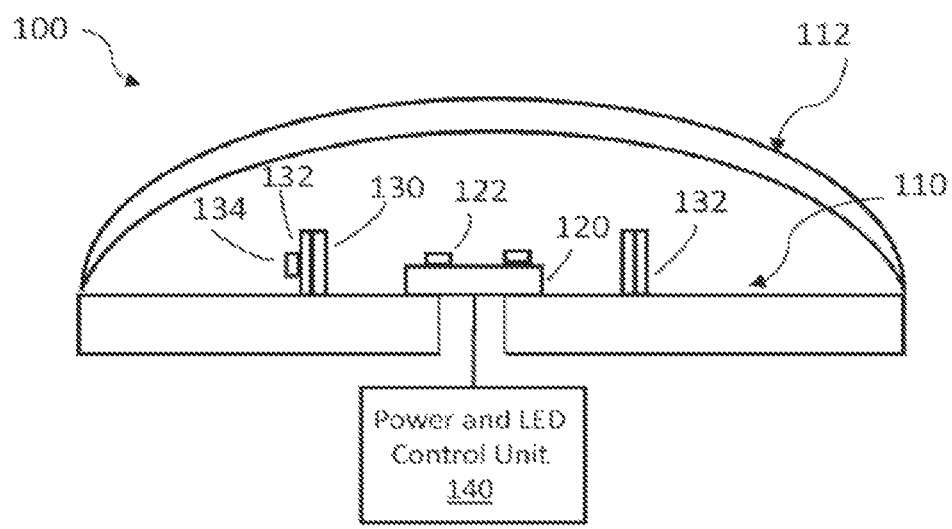

FIGS. 1A and 1B respectively illustrate top and cross sectional views of an example of a lighting system 100 suitable for ceiling attachment and having improved light intensity and color uniformity. The lighting system 100 includes a baseplate 110 able to support various components of the system. The baseplate 110 is typically coated or formed from a highly reflective or white surface to redirect any, incident light out of the system 100 (away from the baseplate 110), The baseplate 110 is co-extensively covered by a translucent diffuser 112 that assists in smoothing out light beam intensity and helping merge any separate color beams, Only attached edges of the diffuser 112 are illustrated in FIG. 1A in order to better see the overall system 100.

The baseplate 110 has an attached circuit board 120 that supports a number of LEDs 122. The circuit board 120 is typically a circular or rectangular printed circuit board able to support LEDs 122, various electronic components, and connecting power and control electrical traces.

The LEDs 122 can be individually set, grouped, or set into an array. The LEDs 122 can emit light of a single color or can further include multiple colors. As illustrated, four groupings of LEDs 122 are shown, for a total of twelve (12) serially connectable LEDs. In operation, the light of LEDs 122 is predominantly emitted away from the circuit board 120 (towards the diffuser 112).

Surrounding circuit board 120 and attached to the baseplate 110 is a frame 130 that supports a flex circuit 132 having LEDs 134. The flex circuit 132 can be laminated onto the frame 130 for mechanical support and cooling. In one embodiment, the frame 130 can be a circular metal frame cut from a stainless steel or aluminum cylinder, Other shapes are also possible, including rectangular, ovoid, or other shapes similar to that of diffuser 112. In some embodiments, a solid frame is not required, with separated studs or attachments points being used to hold the flex circuit. Typically, height of the frame 130 is at least as wide as the flex circuit 132. The frame 130 can also be used to elevate the flex circuit 132 to a suitable height that is determined by the optical design. The frame 130 can have mechanical features that allow quick and easy rigid attachment to the baseplate 110, including but not limited to spring latches, clips, or screw threaded attachment points.

The flex circuit 132 can include one or more flexible strips that support LEDs 134, electrical traces, passive electronic components, such as resistors, transistors, or capacitors, and active electronic components such as LED driver components. In the illustrated embodiment, the flex circuit 132 is dimensioned to form a circular strip, with opposing ends of the strip being optionally mechanically and electrically connected. Typically, the flex circuit 132 is shaped to be similar to frame 130, so it is be flexible enough to form rectangular, ovoid, or other shapes similar to that of diffuser 112. In operation, light from the LEDs 134 of the flex circuit 132 is predominantly emitted perpendicular (i.e. sideways) with respect to the LEDs mounted on the circuit board 120.

Both the flex circuit 132 and circuit board 120 can be serially, in parallel, or separately connected to a power and LED control unit 140. The control unit 140 can control light intensity or color. For example, the control unit 140 can manage correlated color temperature (CCT) tuning over a wide range, with a user being able to change the tint of white light along an industry standard operation (iso)-CCT line desired. One example of a suitable control unit 140 and lighting system is provided by Lumileds proprietary Fusion system, with allows wide tuning color range on a single platform.

In one embodiment, a number of series connected LEDs supported by the circuit board 120 is selected to be matched by the number of series connected LEDs 134 supported by the flex circuit 132. Since the number of LEDs are the same, and electrical characteristics of the LEDs can be selected to be similar or identical, the LED string forward voltages of the LEDs 134, 122 matched. Advantageously, this can ensure that the flex circuit 132 and the circuit board 120 can be connected in parallel without further measures.

Figure 2:
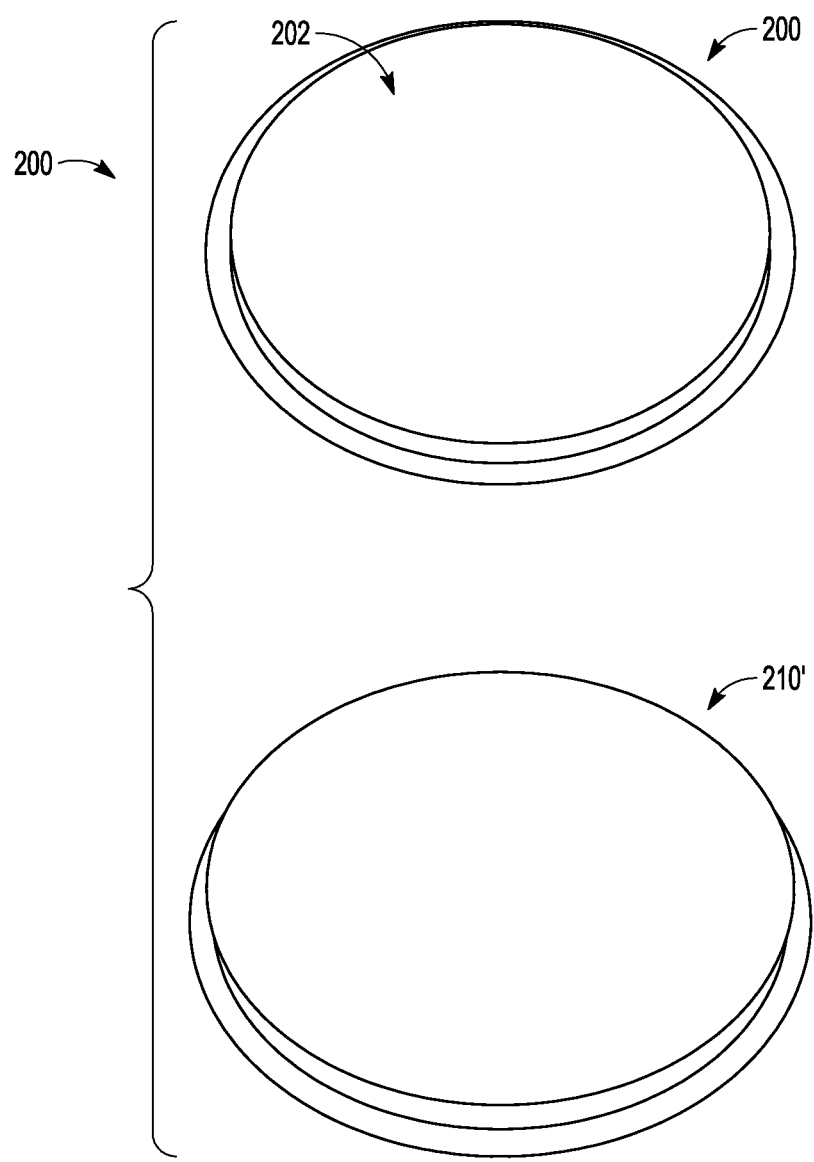
FIG. 2 illustrates a ceiling light with and without a circular flex circuit.

FIG. 2 illustrates a ceiling light 200 without a circular flex circuit installed. As seen, the ceiling light 200 provides nonuniform light, with a visually significant bright spot 202 being evident. When a circular flex circuit is installed as seen with respect to ceiling light 200', the bright spot is significantly reduced.

Figure 3:
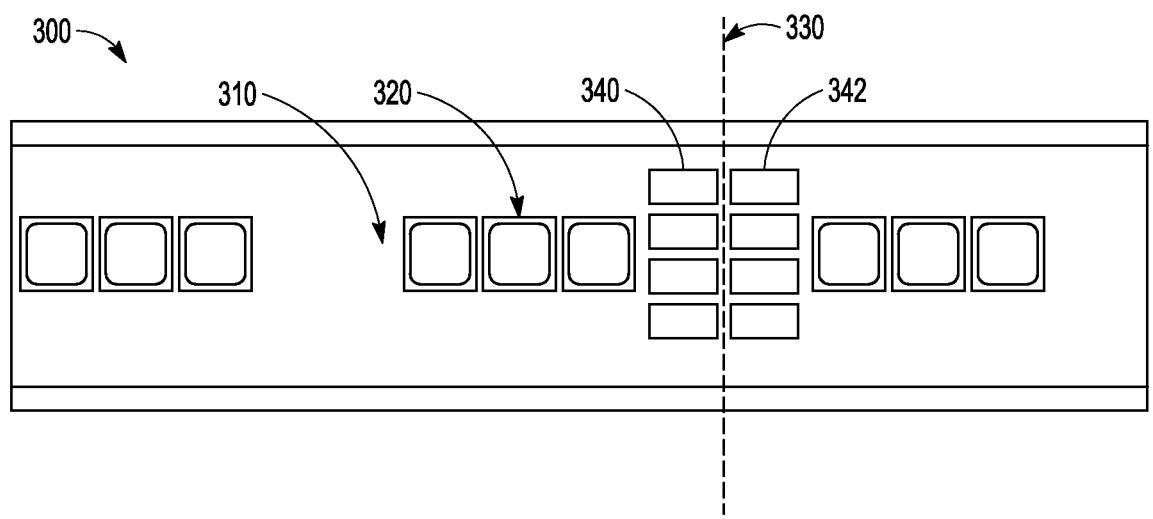
FIGS. 3 and 4 illustrate alternative ways for attaching ends of a circular flex circuit together.
Figure 4:
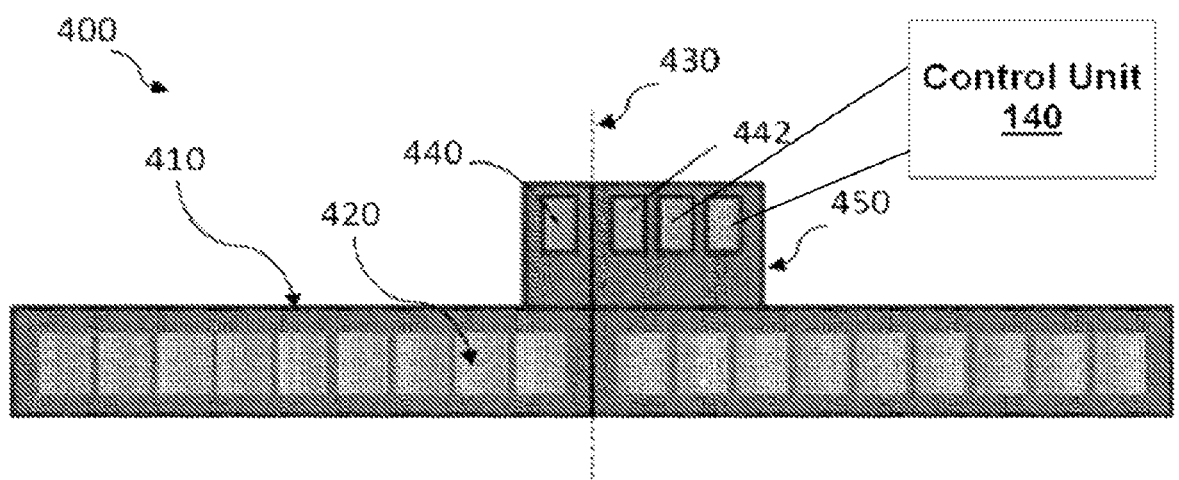

FIGS. 3 and 4 illustrate alternative ways for attaching ends of a circular flex circuit strip together (and to the control unit 140). As seen FIG. 3, a circular attached flex circuit system 300 includes a flex circuit strip 310 supporting a number LEDs 320. The flex circuit strip 310 is joined along dotted line 330, with solder pad contacts 340 and 342 being, respectively, connected to each other. Similarly, as seen in FIG. 4, a circular attached flex circuit system 400 includes a flex circuit strip 410 supporting a number LEDs 420. In contrast to the embodiment of FIG. 3, the flex circuit strip 410 has flaps or tabs 450 that extend away from the strip 410. These tabs 450 can support solder contacts and can simplify connection to external power or control wires. As shown, the flex circuit strip 410 is joined along dotted line 430, with solder contacts 440 and 442 being connected to each other.

The contacts 340, 342, 440, 442 can be connected to power or other control signals of the control unit 140. The signals of the control unit 140 can be connected by a wire, trace, or other conductive member to one the contacts 340, 342, 440, 442 or other contact.

Figure 5:
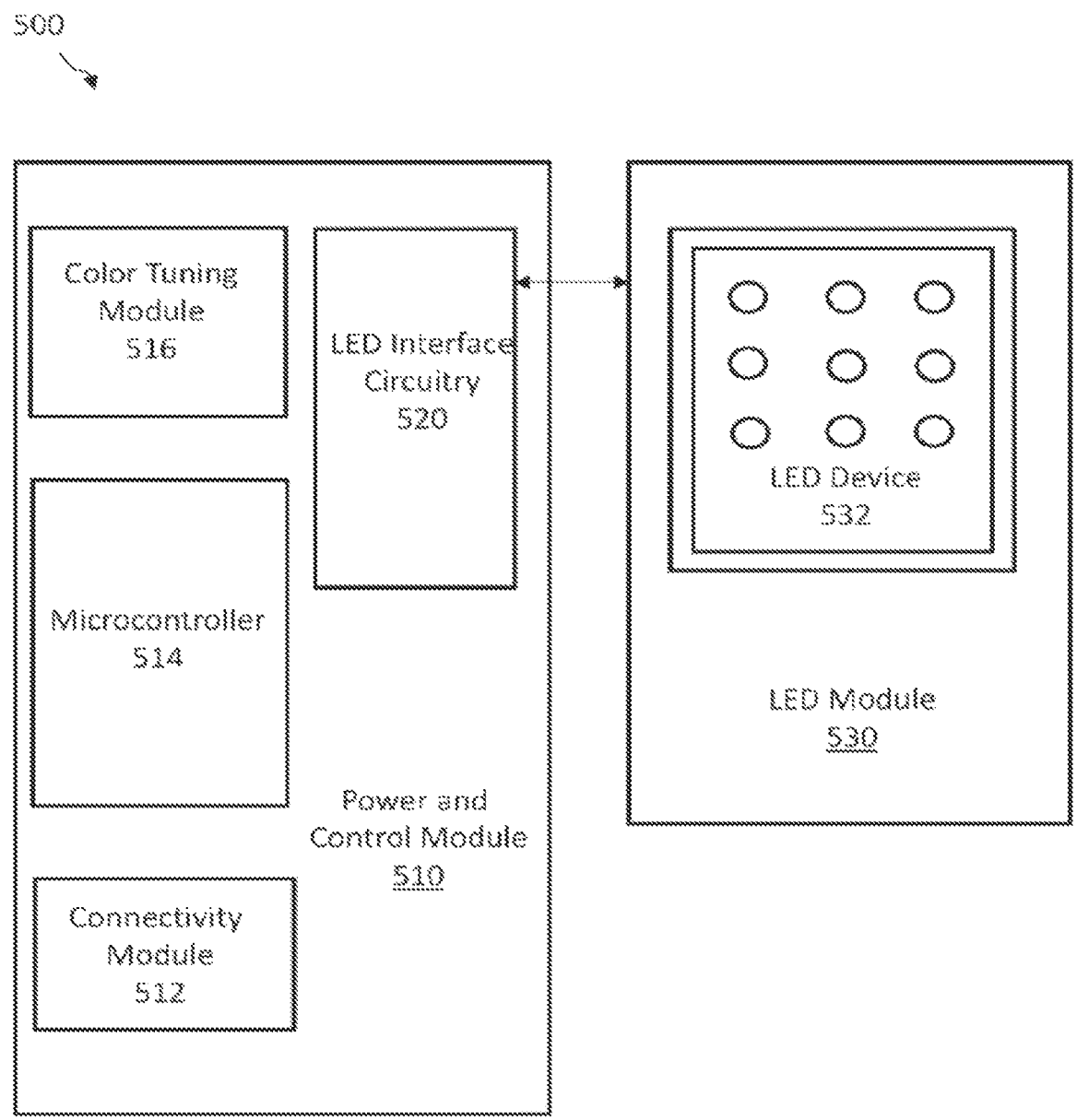
FIG. 5 illustrates a power and LED control unit.

FIG. 5 illustrates a power and LED control unit 500 suitable for controlling a lighting system such as described herein. The control unit 140 can include one or more of the components of the control unit 500. As seen in FIG. 5, the control unit 500 includes a power and control module 510 that includes a connectivity module 512 and connected microcontroller 514. The connectivity module 512 can include wireless or wired connection for user or automatic control via the microcontroller 514. In some embodiments, smart phones with lighting apps installed can be used to provide lighting control and determine lighting status (e.g., lights on or off). The microcontroller 514 can also control a color tuning module 516 that is able to change or adjust LED color. Control and power is provided to LED device 532 in an LED module 530 via LED interface circuitry 520.

The power and LED control unit 500 is similar to that discussed with respect to FIG. 1 and can include necessary circuitry so as to enable the operation of the plurality of LEDs. Furthermore, the LED circuit boards of the LED module or LED device 532 can include the necessary circuitry so as to enable individual or grouped operation of the plurality LEDs in LED device 532. In some embodiments, each LED can be separately controlled by controller, while in other embodiments groups of LEDs can be controlled as a block. In still other embodiments, both single LEDs and groups of LEDs can be controlled. In one embodiment, intensity can be separately controlled and adjusted by setting appropriate ramp times and pulse width for each LED using a pulse width modulation module control unit 500. This allows staging of LED activation to reduce power fluctuations, and to provide superior luminous intensity control.

The LEDs discussed in this disclosure can include but are not limited to LEDs formed of sapphire or silicon carbide. The LEDs can be formed from an epitaxially grown or deposited semiconductor n-layer, A semiconductor p-layer can then be sequentially grown or deposited on the n-layer, forming an active region at the junction between layers. Semiconductor materials capable of forming high-brightness light emitting devices can include, but are not limited to, Group semiconductors, particularly binary, ternary, and quaternary alloys of gallium, aluminum, indium, and nitrogen, also referred to as III-nitride materials. In certain embodiment, laser light emitting elements can be used.

Color of emitted light from the LEDs can be modified using a phosphor contained in glass, or as a pre-formed sintered ceramic phosphor, which can include one or more wavelength converting materials able to create white light or monochromatic light of other colors. All or only a portion of the light emitted by the LEDs may be converted by the wavelength converting material of the phosphor. Unconverted light may be part of the final spectrum of light, though it need not be. Examples of common devices include a blue-emitting LED segment combined with a yellow-emitting phosphor, a blue-emitting LED segment combined with green- and red-emitting phosphors, a UV-emitting LED segment combined with blue- and yellow-emitting phosphors, and a UV-emitting LED segment combined with blue-, green-, and red-emitting phosphors.

Direction of light emitted from each LED can be modified by one or more optics. Optic can be a single optical element or a multiple optic elements. Optical elements can include converging or diverging lenses, aspherical lens, Fresnel lens, or graded index lens, for example. Other optical elements such as mirrors, beam diffusers, filters, masks, apertures, collimators, or light waveguides are also included. Optics can be positioned at a distance from the LED elements in order to receive and redirect light from multiple LEDs. Alternatively, optics can be set adjacent to each LED element to guide, focus, or defocus emitted light. In some embodiments, optics are connected to actuators for movement. In some embodiments, actuator movement can be programmed. This allows, for example, a lens to be moved to increase or decrease beam size.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims. It is also understood that other embodiments of this invention may be practiced in the absence of an element/step not specifically disclosed herein.

The invention claimed is:

1. A light emitting diode (LED) assembly, comprising:
a baseplate,
a diffuser situated over the baseplate;
a circuit board connected to the baseplate and having a first set of LEDs directed to emit light toward the diffuser;
a hollow, integrally formed frame attached about a center of the baseplate and positioned to surround the circuit board and extend beyond a top-most extent of the first set of LEDs;
a flexible circuit strip with a second set of LEDs attached thereto, the flexible circuit strip attached to the frame so as to surround the circuit board, with the second set of LEDs positioned to emit light predominantly perpendicular with respect to the first set of LEDs, the second set of LEDs situated to emit light away from the center.

2. The LED assembly of claim 1, wherein the circuit board is positioned in the center of the baseplate.

3. The LED assembly of claim 1, wherein the diffuser, circuit board, and baseplate are circular.

4. The LED assembly of claim 1, wherein the first and second set of LEDs are connected to each other in parallel.

5. The LED assembly of claim 1, wherein the first and second set of LEDs have the same number of LEDs.

6. The LED assembly of claim 1, wherein color of the first and second set of LEDs is adjustable.

7. The LED assembly of claim 2, wherein ends of the flexible circuit strip are attached to each other.

8. The LED assembly of claim 7, wherein ends of the flexible circuit strip further comprise solder pads.

9. The LED assembly of claim 8, wherein ends of the flexible circuit strip further comprise tabs extending perpendicular from a longitudinal axis of the flexible circuit strip and include (i) solder pads coupled to each other and (ii) further solder pads coupled to a power and control module.

10. The LED assembly of claim 9, wherein the first and second set of LEDs are connected to a power and control module, the power and control module situated on an opposing side of the baseplate as the circuit board, first set of LEDs, the frame, and second set of LEDs.

11. A lighting system, comprising:
a power and control module;
a circuit board with a first set of light emitting diodes (LEDs) directed to emit light in a first direction;
a hollow, integrally formed frame attached about a center of the baseplate and positioned to surround the circuit board and extend beyond a top-most extent of the first set of LEDs;
a flexible circuit strip with a second set of LEDs attached thereto, attached to the frame so as to surround the circuit board, with the second set of LEDs positioned to emit light at a second direction distinct with respect to the first set of LEDs, the second set of LEDs situated to emit light away from the center.

12. The lighting system of claim 10, wherein the first direction is substantially perpendicular with respect to the second direction.

13. The lighting system of claim 10, wherein the frame and the circuit board are attached to a baseplate.

14. The lighting system of claim 10, wherein the first and second set of LEDs are connected to each other in parallel.

15. The lighting system of claim 10, wherein the first and second set of LEDs have the same number of LEDs.

16. The lighting system of claim 10, wherein color of the first and second set of LEDs is adjustable.

17. The lighting system of claim 10, wherein ends of the flexible circuit strip are attached to each other.

18. The lighting system of claim 10, wherein ends of the flexible circuit strip further comprise solder pads.

19. The lighting system of claim 18, wherein ends of the flexible circuit strip further comprise tabs extending perpendicular from a longitudinal axis of the flexible circuit strip and include (i) solder pads coupled to each other and (ii) further solder pads coupled to a power and control module.

20. The lighting system of claim 13, wherein the power and control module further comprises a connectivity module and a color tuning module, the power and control module situated on an opposing side of the baseplate as the circuit board, first set of LEDs, the frame, and second set of LEDs.

* * * * *

UNITED STATES PATENT AND TRADEMARK OFFICE
CERTIFICATE OF CORRECTION

| | |
|---|---|
| PATENT NO. | : 11,808,444 B2 |
| APPLICATION NO. | : 17/742119 |
| DATED | : November 7, 2023 |
| INVENTOR(S) | : Yifeng Qiu |

It is certified that error appears in the above-identified patent and that said Letters Patent is hereby corrected as shown below:

On the Title Page

On page 2, in Column 1, under Item (56) "Other Publications", Line 8, delete "(dated" and insert --dated-- therefor Signed and Sealed this
Second Day of January, 2024

Katherine Kelly Vidal
*Director of the United States Patent and Trademark Office*